(12) United States Patent
Holst (10) Patent No.: US 6,188,596 B1
(45) Date of Patent: Feb. 13, 2001

(54) LAYOUT FOR SEMICONDUCTOR MEMORY INCLUDING MULTI-LEVEL SENSING

(75) Inventor: John Christian Holst, San Jose, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/315,459

(22) Filed: May 20, 1999

(51) Int. Cl.[7] .................................................. G11C 5/06
(52) U.S. Cl. ........................ 365/63; 365/51; 365/230.03
(58) Field of Search .................... 365/63, 51, 230.03, 365/205, 230.01, 189.01

(56) References Cited

U.S. PATENT DOCUMENTS

| | | | |
|---|---|---|---|
| 4,719,602 | 1/1988 | Hag et al. | 365/230 |
| 5,495,445 | 2/1996 | Proebsting | 365/200 |
| 5,646,893 | 7/1997 | McMinn et al. | 365/189.05 |
| 5,648,927 | * 7/1997 | Tran | 365/63 |
| 5,691,933 | * 11/1997 | Takenaka | 365/63 |
| 5,894,448 | * 1/1999 | Amano et al. | 365/230.03 |
| 5,991,223 | * 11/1999 | Kozaru et al. | 365/230.03 |

OTHER PUBLICATIONS

SMD–K6®–III Processor Data Sheet, 21918A0–Feb. 1999, Chapter 2, pp. 5–20.
IEEE International Solid–State Circuits Conference, ISSCC97, SP 25.1: A 200 MHZ RISC Microprocessor with 128kB On–Chip Caches by W. Kever et al., pp. 410–411, and 495 (1997).
IEEE Journal of Solid–State Circuits, vol. 32, No. 11, "Circuit Techniques in a 266–MHz MMX–Enabled Processor", Nov. 1997, pp. 1650–1664.
IEEE Journal of Solid–State Circuits, vol. 25, No. 5, "8–ns CMOS 64Kx4 and 256Kx1 SRAM's", Oct. 1990, pp. 1049–1054.

* cited by examiner

*Primary Examiner*—David Nelms
*Assistant Examiner*—Hoai V. Ho
(74) *Attorney, Agent, or Firm*—Zagorin, O'Brien & Graham, LLP (57) ABSTRACT

A memory module configuration has been developed, which employs multi-level sensing, low-voltage-swing differential signal paths, and array layout techniques to better optimize area/speed/power tradeoffs. In some configurations two-level sensing is employed with secondary sense amplifiers positioned toward a middle of the memory module with memory banks or submodules positioned therearound. Primary sense-amplifiers in the submodules or banks sense differential signals on local bit-lines spanning the corresponding submodule or bank and drive a low-voltage-swing differential signal onto global bit-lines that span a subset of the submodules or banks. The global bit-lines are sensed by secondary sense amplifiers that drive data outputs across a subset of the submodules or banks toward output circuits. In some configurations the memory module is divided into upper and lower portions with upper global bit-lines spanning the upper portion and lower global bit-lines spanning the lower portion. Corresponding upper and lower global bit-lines are disjoint and are sensed by corresponding upper and lower secondary sense amplifiers. By this arrangement, the minimum to maximum variation in access time between the different rows of the memory module is reduced. Moreover, smaller drivers and lower power is achieved by use of such a two-level arrangement. In particular, area reductions and power reductions are achieved for submodule- or bank-resident primary sense amplifiers.

20 Claims, 6 Drawing Sheets

LAYOUT FOR SEMICONDUCTOR MEMORY INCLUDING MULTI-LEVEL SENSING

BACKGROUND OF THE INVENTION

1. Field of the Invention

The present invention relates to semiconductor memories, and in particular, to organization and layout thereof.

2. Description of the Related Art

Semiconductor memories are characterized by regular repetition of memory cells, which are typically organized in an hierarchical addressing topology. Each memory cell is associated with a unique address that typically identifies a particular row and column in a matrix. A group of memory cells is selected by activating a row line (or in some configurations, a word line) to which cells of the group are connected. This enables each of the memory cells so selected, when in a read access mode, to drive its associated column line (or in some configurations, bit-line) in a manner corresponding to the data stored therein. Alternatively, when in a write access mode, each of the selected memory cells is enabled to receive data conveyed on the bit-line to the memory cell.

There are many ways to arrange a bit-line configuration and an associated read circuit. One well-known technique uses a cross-coupled sense amplifier. Typically, a pair of bit-lines couple complementary sides plural of cross-coupled memory cells to a differential amplifier that senses a slight difference in voltage between the two bit-lines and drives a stable, full-level (or full-voltage-swing) signal that may then be further decoded and eventually routed to an output signal path. Sense amplifier circuits are typically constructed from a bi-stable circuit block (such as a cross-coupled differential pair of transistors) that is forced into an unstable state before the bit-lines are to be sensed. During sensing, a slight differential input from the bit-lines pushes the sense amplifier into one of two stable states (e.g., corresponding to a logic "1" or logic "0"). Consequently, conventional sense amplifier circuits can consume significant power while actually sensing the bit-lines.

As memory size increases, fanout and/or downstream signal path impedance tends to increase as bit-lines or sense amplifier output paths span larger proportions of overall layout area. Accordingly, typical speed vs. power trade-offs tend to force larger device sizes, greater power consumption, and/or slower access times. Array partitioning and localized amplification have been used to reduce power consumption in Static Random Access Memories (SRAMs) and thereby improve SRAM speed/power ratios. Two-level sensing has even been used (see e.g., Flannagan et al., 8-ns CMOS 64K×4 and 256K×1 SRAMs, IEEE *Journal of Solid State Circuits*, Vol. 25, No. 5, October 1990, pp. 1049–54) with small signal excursions for power reduction.

Nonetheless, memory configurations are desired which even in combination with array subdivision or small-signal techniques may further reduce power consumption or increase access speed. Indeed memory configurations are desired which better optimize area/speed/power tradeoffs. For memory configurations where large numbers of sense amplifiers are defined within submodules or banks and where large numbers of columns are typically read out simultaneously (e.g., in cache memory or embedded memory applications), area/speed/power tradeoffs associated with submodule- or bank-resident sense amplifiers, or more generally with read data paths, are important. Improved memory configurations are desired.

SUMMARY OF THE INVENTION

Accordingly, a memory module configuration has been developed, which employs multi-level sensing, low-voltage-swing differential signal paths, and array layout techniques to better optimize area/speed/power tradeoffs. In some configurations two-level sensing is employed with secondary sense amplifiers positioned toward a middle of the memory module with memory banks or submodules positioned therearound. Primary sense-amplifiers in the submodules or banks sense differential signals on local bit-lines spanning the corresponding submodule or bank and drive a low-voltage-swing differential signal onto global bit-lines that span a subset of the submodules or banks. The global bit-lines are sensed by secondary sense amplifiers that drive data outputs across a subset of the submodules or banks toward output circuits. In some configurations the memory module is divided into upper and lower portions with upper global bit-lines spanning the upper portion and lower global bit-lines spanning the lower portion. Corresponding upper and lower global bit-lines are disjoint and are sensed by corresponding upper and lower secondary sense amplifiers. By this arrangement, the minimum to maximum variation in access time between the different rows of the module is reduced. Moreover, smaller drivers and lower power is achieved by use of such a two-level arrangement. In particular, area reductions and power reductions are achieved for submodule- or bank-resident primary sense amplifiers.

In configurations, such as cache memory, where large numbers (e.g., 512 or more) of columns are read simultaneously, area and power reductions in correspondingly large numbers of primary sense amplifiers (e.g., 512 or more) per submodule or bank are substantial. For example, in some on-board cache memory module configurations in accordance with the present invention, power dissipation has been reduced by approximately 50% while maintaining high speed operation at processor clock speeds and with a 64-byte read data path. Memory module areas have also been reduced by approximately 10%.

In one embodiment in accordance with the present invention, a semiconductor memory includes upper and lower groups of submodules and disjoint upper and lower bit-line pairs. Each submodule includes an array of memory cells and primary sense amplifiers. The upper bit-line pairs span the upper group of submodules and the lower bit-line pairs span the lower group of submodules. The primary sense amplifiers are coupled to drive a differential signal onto corresponding of the upper or lower bit-line pairs and are placed between the upper and lower groups of submodules. Upper ones of the secondary sense amplifiers are coupled to corresponding of the upper bit-line pairs, and lower ones of the secondary sense amplifiers are coupled to corresponding of the lower bit-line pairs.

In a semiconductor memory embodiment in accordance with the present invention, a data path includes a first differential bit-line pair, a first primary sense amplifier, and a first secondary sense amplifier. The first differential bit-line pair spans plural memory cells of a first bank including a first memory cell. The first primary sense amplifier is coupled between the first differential bit-line pair and coupled to supply a first differential output on a second differential bit-line pair spanning a first group of banks including the first bank. The first secondary sense amplifier is coupled between the second differential bit-line pair and coupled to supply a full-voltage swing output on a data line, wherein the data line spans a second group of banks. In a further variation, the data path also includes a third differential bit-line pair, a second primary sense amplifier, and a second secondary sense amplifier. The third differential bit-line pair spans plural memory cells of a second bank including a second memory cell. The second primary sense amplifier is coupled between the third differential bit-line pair and coupled to supply a second differential output on a fourth differential bit-line pair spanning a second group of banks disjoint from the first group of banks and including the second bank. The second secondary sense amplifier is coupled between the fourth differential bit-line pair and coupled to supply a full-voltage swing output on the data line.

In another embodiment in accordance with the present invention, a method of reducing a difference between minimum and maximum delay paths in a semiconductor includes the following: providing plural submodules each including an array of memory cells and primary sense amplifiers coupled to respective ones of the memory cells by local bit-lines; spanning a first subset of the submodules with first bit-line pairs coupled to outputs of the primary sense amplifiers of the first subset of submodules; spanning a second subset of the submodules with second bit-line pairs coupled to outputs of the primary sense amplifiers of the second subset of submodules, the second bit-line pairs disjoint from the first bit-line pairs; and placing secondary sense amplifiers between the first and second subsets of submodules, the secondary sense amplifiers input coupled to respective of the first and second bit-line pairs and output coupled to respective data lines, wherein individual ones of the data lines span one, but not both, of the first and second subsets of submodules.

In still another embodiment in accordance with the present invention, a method of reducing power consumption in a semiconductor memory including plural submodules, each having an array of memory cells and primary sense amplifiers coupled to respective ones of the memory cells by local bit-lines, includes the following: spanning a first subset of the submodules with first bit-line pairs; spanning a second subset of the submodules with second bit-line pairs disjoint from the first bit-line pairs; and placing secondary sense amplifiers between the first and second subsets of submodules, the secondary sense amplifiers being input coupled to respective of the first and second bit-line pairs and being output coupled to respective data lines. The primary sense amplifiers are coupled to drive low-voltage-swing differential signals onto corresponding of the first and second bit-line pairs.

In still yet another embodiment in accordance with the present invention, a method of improving access time in a semiconductor memory having plural submodules each including an array of memory cells and primary sense amplifiers coupled to respective ones of the memory cells by local bit-lines includes the following: spanning a first subset of the submodules with first bit-line pairs; spanning a second subset of the submodules with second bit-line pairs disjoint from the first bit-line pairs; and placing secondary sense amplifiers between the first and second subsets of submodules, the secondary sense amplifiers being input coupled to respective of the first and second bit-line pairs and being output coupled to respective data lines. Wire delay along signal paths from individual of the memory cells is reduced by operating the secondary sense amplifiers as repeaters and maximum to minimum variations round-trip signal paths are reduced by the secondary sense amplifier placement.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
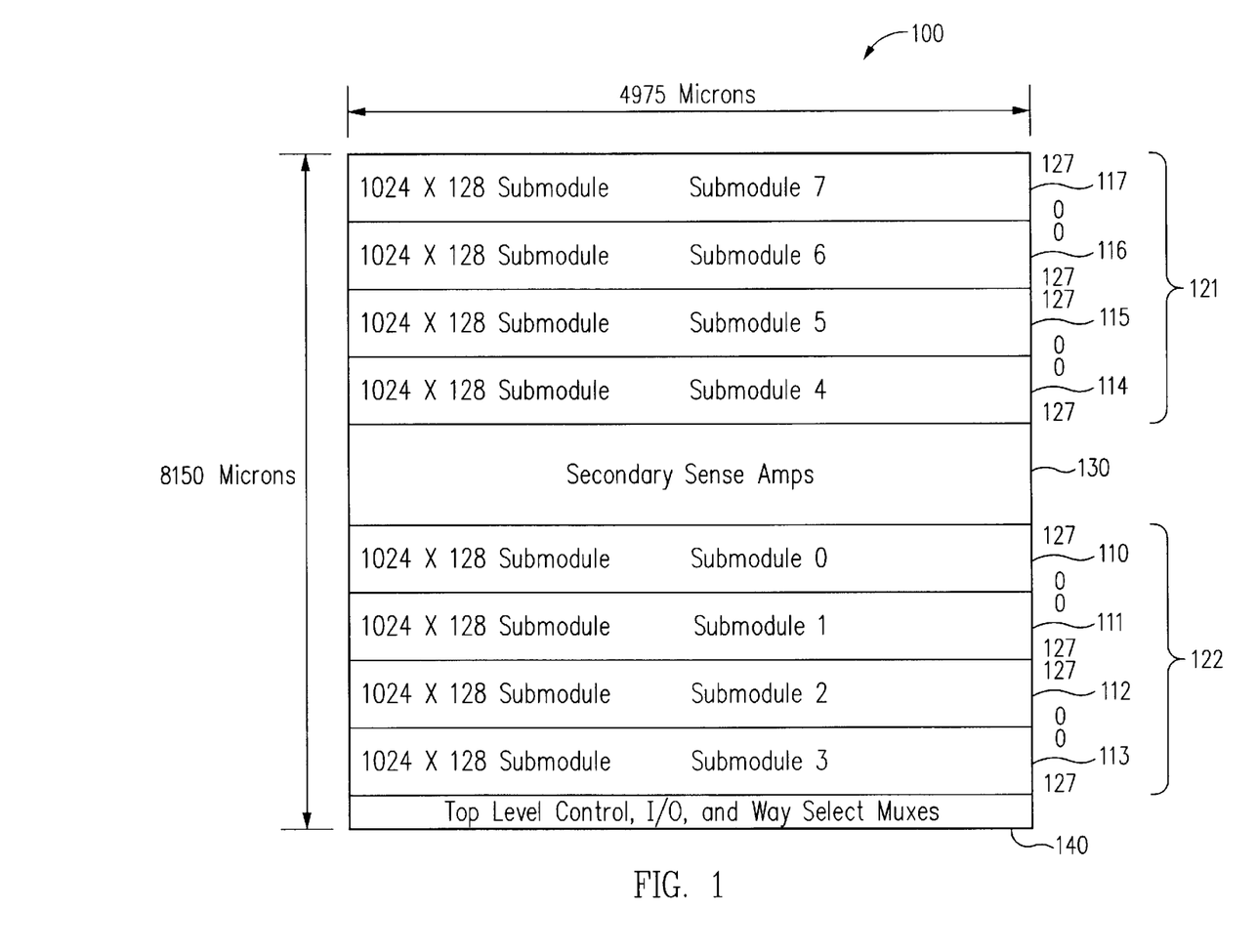
FIG. 1 depicts a layout of an eight (8) submodule memory module in accordance with an exemplary embodiment of the present invention.

FIG. 1 depicts the organization and layout of a memory module 100 in accordance with an exemplary embodiment of the present invention. Eight submodules or banks 110, 111, 112, 113, 114, 115, 116 and 117 are organized into upper and lower groups 121 and 122. In the embodiment of FIG. 1, the submodules are substantially identical and each includes an array of memory cells, word line drivers and word line decoders, column decoders, primary sense amplifiers, write drivers, equilibrate circuits, and control circuitry (not shown). In this regard, the submodules are conventional and, based on the description herein, a variety of suitable configurations will be appreciated by persons of ordinary skill in the art. However, in accordance with some embodiments of the present invention, advantageous primary sense amplifier configurations are described in greater detail below with reference to FIG. 4. Secondary sense amplifiers 130 (FIG. 1) are positioned toward the center of memory module 100 between upper and lower groups 121 and 122 of submodules. Top-level control, I/O, way-select multiplexers and other logic (shown collectively as logic 140) are positioned toward a periphery of memory module 100.

Figure 2:
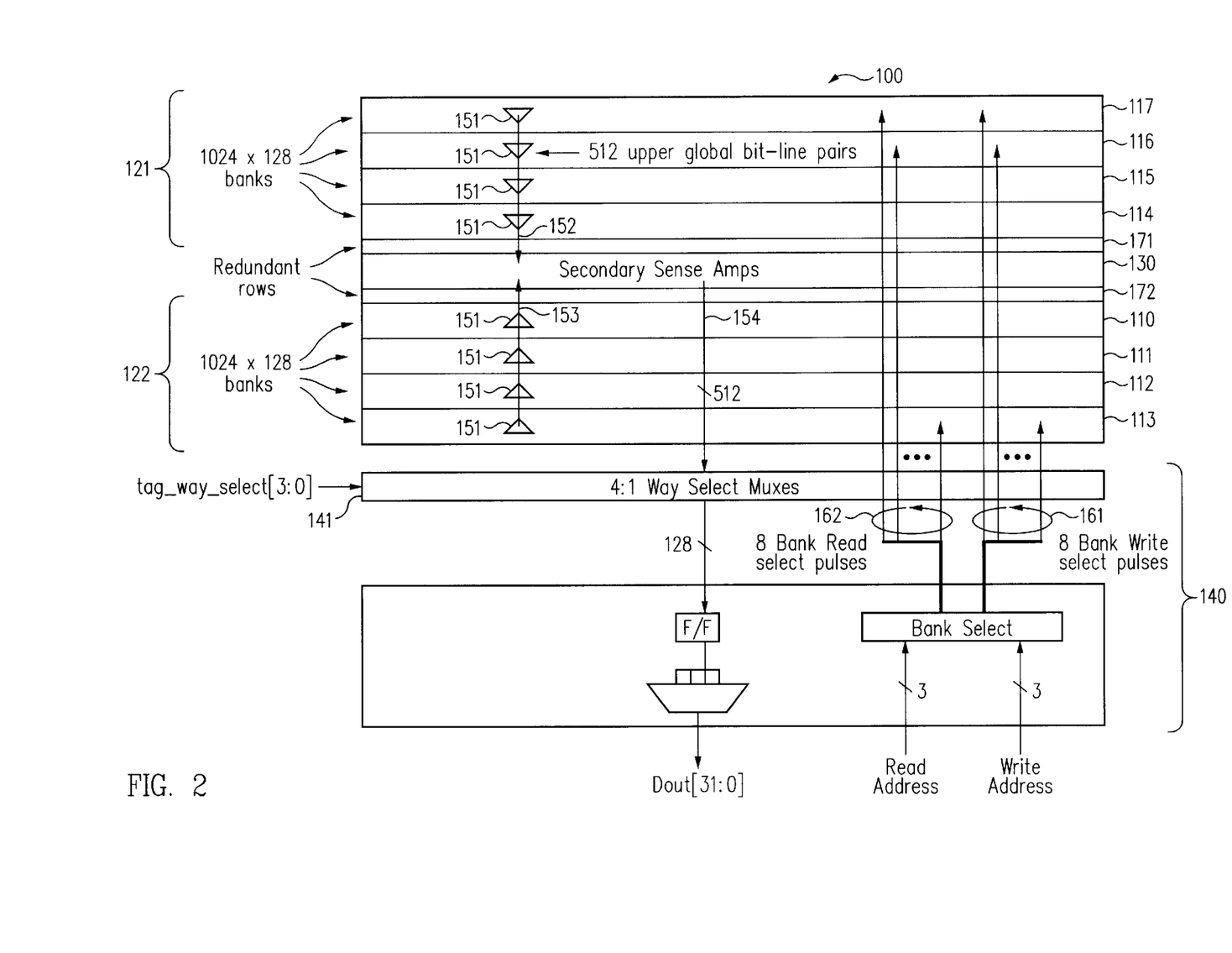
FIG. 2 is a block diagram illustrating signal paths in an eight (8) submodule memory module such as that depicted in FIG. 1.

FIG. 2 depicts the organization of memory module 100 and round-trip signal paths in greater detail. Logic 140 receives read and write addresses and supplies bank select pulses (on lines 162 and 161, respectively) to corresponding submodules of memory module 100 based on the upper address bits of the read or write address (e.g., RA[15:13] or WA[15:13]). Remaining address bits are used for word line select, column select and way select. In the case of read access, word line selection (based on RA[12:6]) and 2:1 column multiplexing (based on RA[5]) are performed at the submodule level, whereas way selection is performed at way select multiplexers 141. As a result, each submodule (e.g., submodule 110, 111, 112, 113, 114, 115, 116 or 117) includes 128 word lines and 1024 columns multiplexed (2:1) onto 512 primary sense amplifiers 151. In the case of write access, write way selection decode occurs within the submodules.

Although other topologies are possible and the above-described read and write topology is merely exemplary, the description that follows is based on the exemplary topology for specificity of description. Nonetheless, embodiments in accordance with the present invention are not limited to the exemplary topology. Based on the description herein, persons of ordinary skill in the art will appreciate a wide variety of suitable topologies that may fall within the scope of claims that follow.

Referring again to FIG. 2, local bit-line pairs (not shown) span the corresponding submodule and corresponding primary sense amplifiers 151 supply differential signals on global bit-line pairs (e.g., upper global bit-line pairs 152 and lower global bit-line pairs 153). In the embodiment of FIG. 2, four corresponding primary sense amplifiers 151 of upper group 121 submodules supply differential signals on each of 512 corresponding upper global bit-line pairs 152. Similarly, four corresponding primary sense amplifiers 151 of lower group 122 submodules supply differential signals on each of 512 corresponding lower global bit-line pairs 153. In the embodiment of FIG. 2, an upper secondary sense amplifier (not shown) of secondary sense amplifiers 130 is coupled to upper global bit-line pairs 152 and a lower secondary sense amplifier (not shown) of secondary sense amplifiers 130 is coupled to lower global bit-line pairs 152. Outputs of corresponding upper and lower secondary sense amplifiers are driven onto a corresponding one of output signal paths 154.

In some configurations in accordance with the present invention, only one submodule or bank is selected and either upper ones or lower ones of secondary sense amplifiers 130 are strobed by a signal originating in the selected submodule. Therefore, only one of corresponding upper and lower secondary sense amplifiers drives its output onto data lines 154. In other embodiments, selection circuitry may be employed. Way select multiplexers 141 perform read way selection downstream from the secondary sense amplifiers. In implementations in which read way selection signals arrive late in a memory access cycle, this positioning helps to take way selection off a critical timing path. However, other implementations may perform read way selection in other manners, e.g., within the submodules or in conjunction with secondary sense amplifier operation. In configurations that perform way selection upstream of the primary sense amplifiers and in which way selection information is available early in a memory access cycle, power requirements and area can be reduced since fewer sense amplifiers would typically be required.

For ease of illustration, only a single one of the 512 upper global bit-line pairs 152, lower global bit-line pairs 153 and output signal paths 154 are illustrated in FIG. 2. The data path from memory cells to data line output via primary and secondary sense amplifiers is described in greater detail below with respect to FIG. 3. However, some advantages of configurations in accordance with the present invention will better understood with reference to FIG. 2.

One advantage of the memory module organization depicted in FIG. 2 is a reduction in the difference between minimum and maximum access times. Logic 140 depicts the physical location where top-level control functions occur. For example, the three most significant read address bits (RA[15:13]) are decoded to activate 1-of-8 Bank Read Select pulses on lines 162. The particular bank read select pulse activates a corresponding submodule or bank (e.g., bank 113, 112, 111, 110, 114, 115, 116 or 117), which thereupon transfers its data to the secondary sense amplifiers of secondary sense amplifiers 130 using corresponding ones of the global bit-lines (i.e., global bit-lines 152 or 153). Of note, in a 2:1 column multiplexing embodiment such as that described above, 512 primary sense amplifiers per bank drive differential signals onto 512 of the upper or lower global bit-line pairs (152 or 153), although larger or smaller numbers of primary sense amplifiers per bank are possible.

Corresponding secondary sense amplifiers of secondary sense amplifiers 130, in turn, sense the differential signal on the global bit-lines and drive data out to 4:1 way select multiplexers 141, which feed the output flip flops. Of note, in certain configurations, the secondary sense amplifiers are strobed by a signal that originates in the selected memory bank. For example, in one source synchronous strobing configuration, global bit-lines are wired to the outputs of primary sense amplifiers associated with four different submodules. Each submodule can drive its data onto the global bit-lines one at a time, and each submodule can have slightly different timing due to its physical position. In each submodule, the primary sense amplifiers are strobed. There is one primary sense amplifier strobe in each submodule. Four primary sense amplifier strobe signals (one from each submodule) are routed to the secondary sense amplifier strobe driver where the signals are ORed together and buffered to drive the secondary sense amplifier strobe. Since the primary sense amplifier strobe and the data on the global bit-lines are driven from the same driving block (submodule) and received at the same receiving block (secondary sense amplifiers and their associated strobe driver), the strobing is source synchronous.

Referring to FIG. 2, a significant portion of the total access time is due to the delay of signals propagating from the top level control circuits (e.g., of logic 140) out to the memory banks and back again. Bank 117 is farthest from the top-level control block. Since both the Bank Read Select pulse to bank 117 and the data read from bank 117 travel the greatest distance (indeed, this is the longest "round trip" distance), bank 117 has the maximum access time. Of note, banks 113, 112, 111 and 110 exhibit essentially the same round trip distance. Accordingly, their access times are nearly identical.

If secondary sense amplifiers 130 had been placed at the "bottom" of the memory module, i.e., adjacent to the top level control block, bank 113 would have a round trip distance significantly shorter than minimum round trip distance of FIG. 2 and hence, a lower access time. In general, large differences between the minimum and maximum delay paths through a circuit are undesirable. Such differences make it more difficult to satisfy the hold time requirements of the downstream synchronizing elements. In the case of memory module 100, hold time constraints affect flip/flops downstream from 4:1 way select multiplexers 141. By placing secondary sense amplifiers 130 between upper and lower groups (121 and 122) of banks or submodules, access time variations amongst the banks or submodules are reduced. In the embodiment of FIG. 2, the worst case round-trip signal path to and from bank 117 is no more than twice the length of the best case round-trip signal path to and from bank 113, 112, 111 or 110. Note that, in this context, length refers to physical length (meters), not delay (seconds). In fact, the worst case delay will typically be much less than twice the minimum delay.

Although equal numbers of upper and lower group submodules or banks facilitate symmetric device and circuit configurations, dissimilar numbers of upper and lower banks are also possible, and based on the description herein, persons of ordinary skill in the art will appreciate suitable modifications to device sizes and circuit configurations to accommodate differing upper and lower half impedance and fan-out characteristics. For example, in another configuration (not shown), the memory module can be organized as a lower group of five (5) banks and an upper group of three (3) banks (instead of 4 and 4). By providing a smaller set of upper banks, signal paths from the upper banks are made slightly faster, since there is less fanout on upper global bit-lines. As a result, minimum-to-maximum delay variation could be even tighter. Other configurations are also possible.

Figure 3:
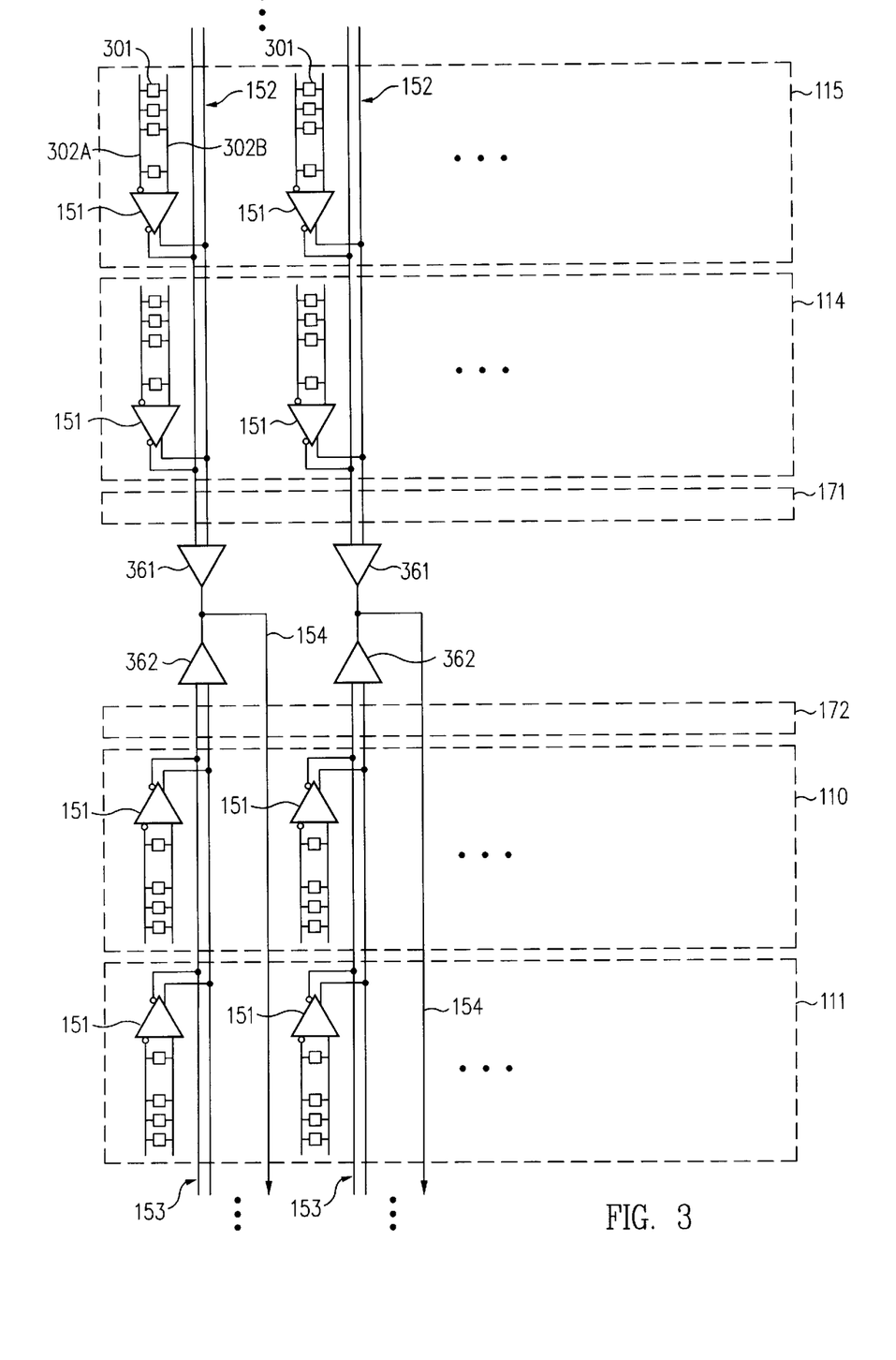
FIG. 3 illustrates aspects of an exemplary two-level sensing data path from memory cells in a memory module such as that depicted in FIGS. 2 and 3.

A second advantage of placing secondary sense amplifiers 130 toward the middle of memory module 100 (e.g., as illustrated in FIGS. 1 and 2) is that it reduces the length of the global bit-lines. Global bit-lines 152 span the four submodules of upper group 121 whereas global bit-lines 153 span the four submodules of lower group 122. Because, global bit-lines 152 and 153 are disjoint, maximum access time is reduced without increasing power dissipation or area consumption. FIG. 3 illustrates an exemplary realization of disjoint global bit-lines 152 and 153 wherein 2:1 column multiplexing is ignored for simplicity and wherein only two submodules or banks and only two global bit line pairs per group are explicitly illustrated.

If the global bit-lines instead spanned all 8 submodules, it would, in general, take twice as long for a sense amplifier within the submodule to drive a given voltage differential onto the global bit-lines. In one embodiment, a design target is to strobe the secondary sense amplifiers (e.g., secondary sense amplifiers 361 or 362) when there is about 150 mV of differential signal on the global bit-lines (e.g., global bit-lines 152 or 153). As described above with respect to an exemplary embodiment, only one-of-eight banks is selected and a source-synchronous strobing/clocking scheme is used to strobe the secondary sense amplifiers. Therefore, the wired-OR outputs of corresponding secondary sense amplifiers 361 and secondary sense amplifiers 362 is suitable. In other configurations (not shown), other output selection schemes may be employed while still achieving benefits of a disjoint global bit-line design. For example, lower power, faster access time, and reduced minimum-to-maximum delay variation are all achieved in configurations (not shown) that employ a multiplexor to select between upper and lower secondary sense amplifier outputs or that employ circuitry to selectively couple either upper or lower global bit-lines (but not both) to inputs of a set of secondary sense amplifiers.

If the global bit-lines spanned all 8 submodules, submodule- or bank-level sense amplifiers would burn twice as much power to drive a fixed voltage onto corresponding global bit-lines that would be twice as capacitive. In the embodiment of FIG. 3, global bit-lines 152 and 153 convey low-voltage-swing signals, but are differential and dynamic. On the other hand, data lines 154 convey signal outputs of selected secondary sense amplifiers (e.g., secondary sense amplifiers 361 or 362) that are full-voltage-swing signals, but single-ended and static. In an exemplary configuration, low-voltage-swing signals typically range between 120 mV and 150 mV of differential bit-line signal, although persons of ordinary skill in the art will appreciate that suitable values are process technology and implementation specific. On the other hand, exemplary full-voltage-swing signals typically swing from 0 V to the positive core supply voltage ($V_{DD}$). In an exemplary 0.25 μm process, this positive core supply voltage is typically 2.25 V. In an exemplary 0.18 μm process, this positive core supply voltage may be in the range of 1.5 to 1.8 V. As with the low-voltage-swing signal ranges, persons of ordinary skill in the art will appreciate that suitable values are process technology and implementation specific.

Note that much of the power savings associated with cutting the global bit-line length in half is expended to drive the data from the secondary sense amplifiers (see FIG. 3) back across the lower group 122 submodules 110, 111, 112 and 113 to the way select multiplexers 141. As before, suitable values are process technology and implementation specific. Fanouts and device sizes can be optimized to achieve power savings in the multi-level sense amplifier design. For example, in configurations employing two-level sensing using low-voltage-swing, differential, precharged signals, the comparison between multi-level sensing and full-swing signals is largely a function of the amplitude of the low-voltage-swing signal relative to the full-voltage-swing signal. Since the differential, precharged lines will switch at frequency f, whereas the static (full-voltage-swing) signal will switch, on average, at frequency f/4, there is generally a net power savings if the amplitude of low-voltage-swing signals is less than $V_{DD}/4$.

Nonetheless, an important speed advantage of disjoint upper and lower global bit-lines results from the observation that, other factors being equal, the delay along a wire is proportional to the square of its length. When the length of a line is doubled, its capacitance doubles and its resistance doubles. The RC product, commonly referred to as "wire delay," would dominate the delay of a global bit-line signal signal traversing all submodules (e.g., 8 submodules). By positioning secondary sense amplifiers 130 toward the middle of memory module 100, the secondary sense amplifiers provide the advantage of repeaters. Acting as repeaters, secondary sense amplifiers 130 speed up signals along a data path from a submodule or bank (e.g., from bank 115) because the sum of two shorter delays, namely the sum of delays associated with global bit-lines 152 and with data lines 154, is less than that imposed by a single set of bit-lines, even considering delay through the secondary sense amplifiers 130.

Of note, similar issues of wire delay apply to the bank read and write select pulses supplied on lines 162 and 161 (see FIG. 2). For this reason, repeaters (not shown) are used along those of lines 162 and 161 that extend to submodules or banks of upper group 121. For efficiency of layout, such repeaters are co-located with secondary sense amplifiers 130, although other configurations are also possible.

A third advantage of sense amplifier and bit-line configurations such as illustrated in FIGS. 2 and 3 traces to the combination of multi-level sensing and reduced span of bit-lines, which, in embodiments in accordance with the present invention, allows a memory module 100 configuration that it is physically small and has low power consumption, yet achieves nearly the minimum delay possible. In particular, layout area consumed by primary sense amplifiers 151 is significantly reduced as compared to conventional designs. In memory module configurations such as an on-board cache application of memory module 100, wherein large numbers of columns (e.g., 512 in the above illustrated embodiments) are simultaneously read out of a submodule or bank, sense amplifier layout area is an important factor in overall layout area and yield.

Referring now to FIG. 3, primary sense amplifiers 151 are input coupled to memory cells (e.g., memory cells 301) via complementary local bit-lines (e.g., local bit-lines 302A and 302B) and output coupled to corresponding ones of secondary sense amplifiers 361 (or 362) via corresponding ones of global bit-lines 152 (or 153). As illustrated in FIGS. 2, global bit-lines 152 and global bit-lines 153 are relatively long, capacitive lines long, each spanning four submodules or banks of memory module 100. During a read cycle, primary sense amplifiers 151 of an activated bank drive a low-voltage-swing differential signal onto the corresponding global bit-lines. Suitable designs for primary sense amplifiers 151 are therefore influenced by delay and fanout considerations.

Figure 4:
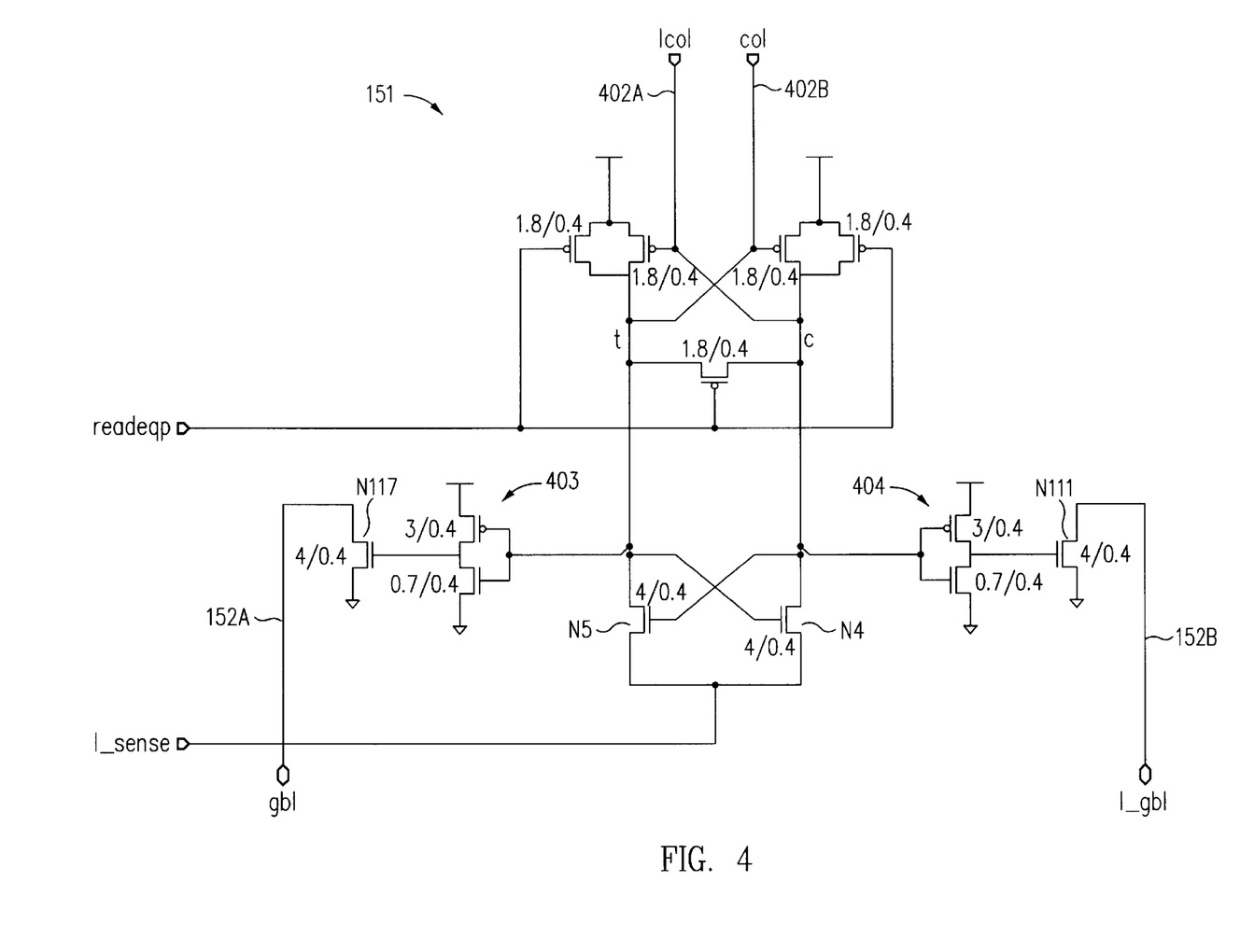
FIG. 4 is a circuit diagram illustrating a primary sense amplifier configuration suitable for use in some embodiments in accordance with the present invention.

FIG. 4 illustrates a design for primary sense amplifiers 151, which is suitable for the configuration of FIGS. 2 and 3 wherein primary sense amplifiers drive low-voltage-swing differential signals onto global bit-lines 152A and 152B. Device sizes indicated in FIG. 4 are in accordance with an exemplary embodiment of the present invention. However, reductions in layout area consumed by such a primary sense amplifier design are illustrated by way of example. For example, to drive a full-voltage-swing signal with minimum delay onto global bit-lines, the fanout of devices N111 and N117 would be optimized at a size of about 40 microns of gate (rather than 4 microns as illustrated in FIG. 4). In turn, inverters 403 and 404 with a size of approximately 10 microns of gate, including an 8 micron PMOS device and a 2 micron NMOS device (rather than 3 and 0.7 microns as illustrated in FIG. 4), would be used to drive these 40 micron devices. In turn, devices N4 and N5 would also be increased in size to drive the 10 microns of inverter gate. Of note, the corresponding devices of primary sense amplifier 151 illustrated in FIG. 4 are much smaller than would otherwise be required to drive a full-voltage-swing signal onto the global bit-lines. For example, devices N111 and N117 are ten times smaller than would be used to drive full-voltage-swing signals.

In general, delay, D, is a function of fanout, both in terms of capacitance and voltage. Written as an equation:

$$D = K(C_o * V_o)/(C_i * V_i)$$

where K is a constant that subsumes process, power supply voltage, temperature and other factors. Capacitance, $C_o$, is fixed. The voltage swing of the gates of devices N111 and N1117, $V_i$, is also fixed. As a result, delay is unchanged if both the voltage swing of the global bit-lines, $V_o$, and the size of devices N111 and N1117, $C_i$, are reduced by a factor of 10. The end result is that much less layout area is consumed by primary sense amplifiers 151 in the submodules to drive low-voltage-swing signals onto global bit-lines 152A and 152B with no change in delay. Of course, the low-voltage-swing signals have an amplitude that is one tenth that of a full-voltage-swing signal.

In the memory module configurations of FIGS. 1–3, primary sense amplifier area savings are important since each submodule or bank includes 512 primary sense amplifiers 151 and since there are 8 submodules in memory module 100. In the exemplary configuration of FIG. 4, each primary sense amplifier 151 has been reduced in size by about 100 microns of gate width. By employing two-level sensing as described herein, overall layout area consumed by memory module 100 was reduced by 5–10%.

Although two-level sensing has been used in memories (see e.g., Flannagan et al., 8-ns CMOS 64K×4 and 256K×1 SRAMs, IEEE *Journal of Solid State Circuits*, Vol. 25, No. 5, October 1990, pp. 1049–54), use of multi-level sensing for area reduction is not described in the literature. Indeed for many designs, area reduction benefits, had they been discovered, would not be substantial. However, in applications such as cache RAM (or other embedded application), many bits at a time are typically read. For example, in the exemplary configuration of memory module 100, 512 bits are read in parallel and driven onto 512 bit lines. This requires 512 sense amplifiers. Because so many bits are read in parallel and because large numbers of sense amplifiers (e.g., 512) must exist in each submodule, the physical size of the submodule- or bank-level sense amplifier is important. As described herein, multi-level sensing may be used to reduce layout area in a semiconductor memory design.

Relative to the case where full-swing signals are used on the global bit-lines, there is a significant power savings. The power dissipation of signals on the global bit-lines is proportional to the square of the voltage swing of those signals. Compare the power dissipation of a full-swing signal of 2 Volts to a low-swing signal of 0.2 Volts: $(2/0.2)^2 = 100$. For each read access, there are 512 global bit-lines which must carry a signal (either bit or bit will switch).

Figure 5:
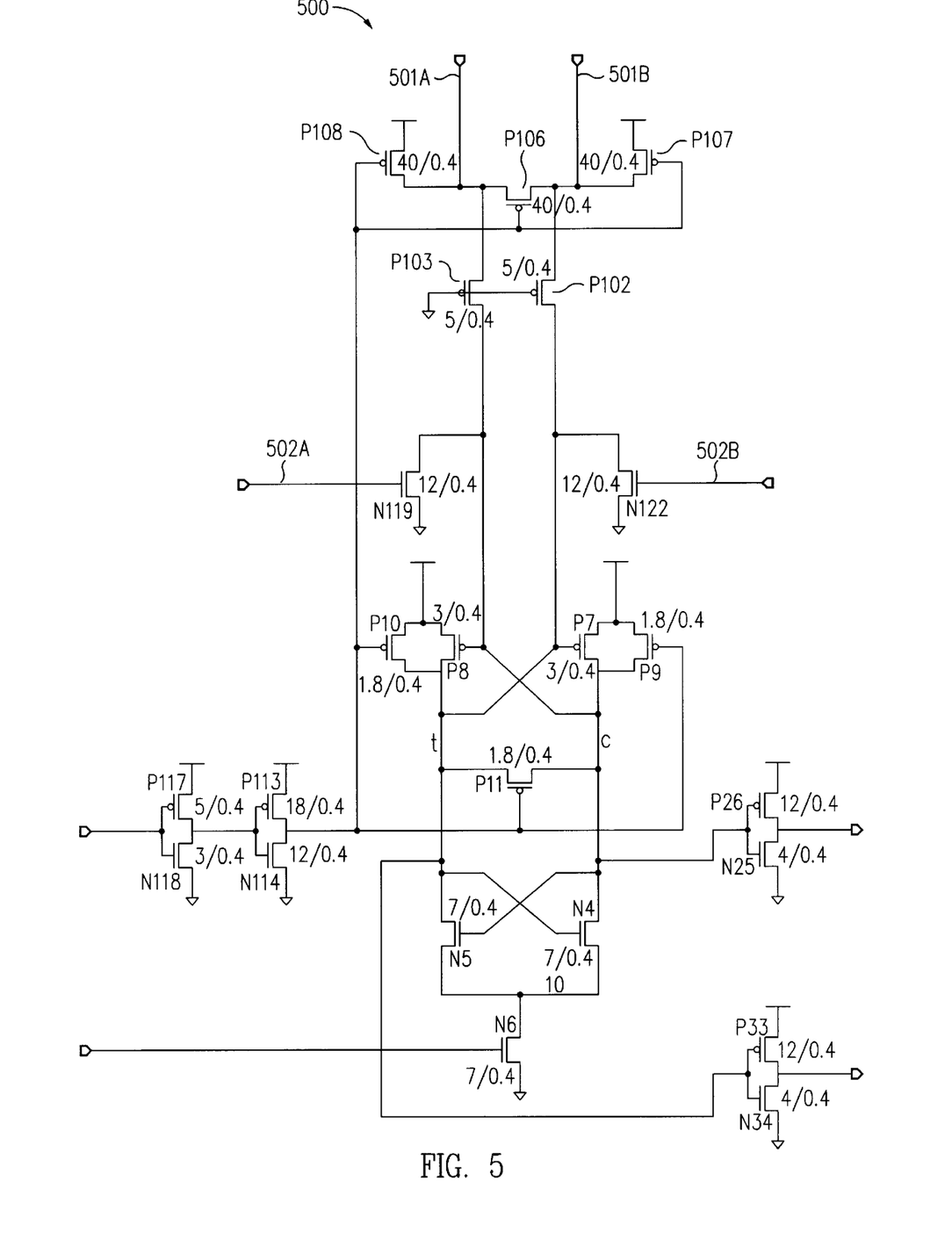
FIG. 5 is a circuit diagram illustrating a secondary sense amplifier configuration suitable for use in some embodiments in accordance with the present invention.

Any of a variety of standard regenerative sense amplifier designs are suitable for use as individual ones of secondary sense amplifiers 130 (FIGS. 1 and 2) or upper and lower secondary sense amplifiers 361 and 362 (FIG. 3). However, FIG. 5 illustrates one particular sense amplifier configuration that includes facilities for overpowering global bit line inputs with redundant data. Although embodiments in accordance with the present invention need not include such facilities, the secondary sense amplifier configuration of FIG. 5 is presently preferred and is described in greater detail in a co-pending patent application entitled, "Redundancy Circuit and Method for Semiconductor Memory" application Ser. No. 09/315,458, naming Holst as inventor and filed on even date herewith, the entirety of which is hereby incorporated by reference. In summary, differential global bit line pair inputs 501A and 501B correspond to upper global bit-lines 152 or lower global bit-lines 153. PMOS devices P108, P106, and P107 provide an equilibrate/precharge facility for the corresponding global bit-line pair. PMOS devices P102 and P103 act as resistance to isolate the high capacitance of global bit-lines from the internal nodes of the secondary sense amplifier. This isolation resistance is important for switching speed of secondary sense amplifier 500 and for forwarding of redundant data (at complementary inputs 502A and 502B) directly into the secondary sense amplifier, although other designs, such as gate isolated designs, would also be suitable. NMOS devices N119 and N122 provide the path by which redundant data is forwarded into secondary sense amplifier 500. In other respects, secondary sense amplifier 500 is conventional.

The orientations of sense amplifiers in FIGS. 1–3 are illustrative of overall direction of signal flows and of overall signal path characteristics in accordance with the various embodiments of present invention; however, in some embodiments, orientation of submodules or banks may be modified to achieve additional benefits. Though not essential to semiconductor memory organizations in accordance with the present invention, some embodiments may employ a back-to-back orientation of some submodules or banks as illustrated in the above-incorporated co-pending patent application entitled, "Redundancy Circuit and Method for Semiconductor Memory" application Ser. No. 09/315,458, naming Holst as inventor and filed on even date herewith. In addition, and also not essential to the semiconductor memory organizations in accordance with the present invention, some embodiments may further employ a novel guard cell technique in the two dimensional arrays of memory cells within one or more submodules or banks. Such guard cell techniques are described in a co-pending patent application entitled, "Use of Functional Memory Cells as Guard Cells in a Semiconductor Memory" application Ser. No. 09/315,457, naming Holst as inventor and filed on even date herewith, the entirety of which is hereby incorporated by reference.

Processor, Integrated Circuit and System Embodiments

Figure 6:
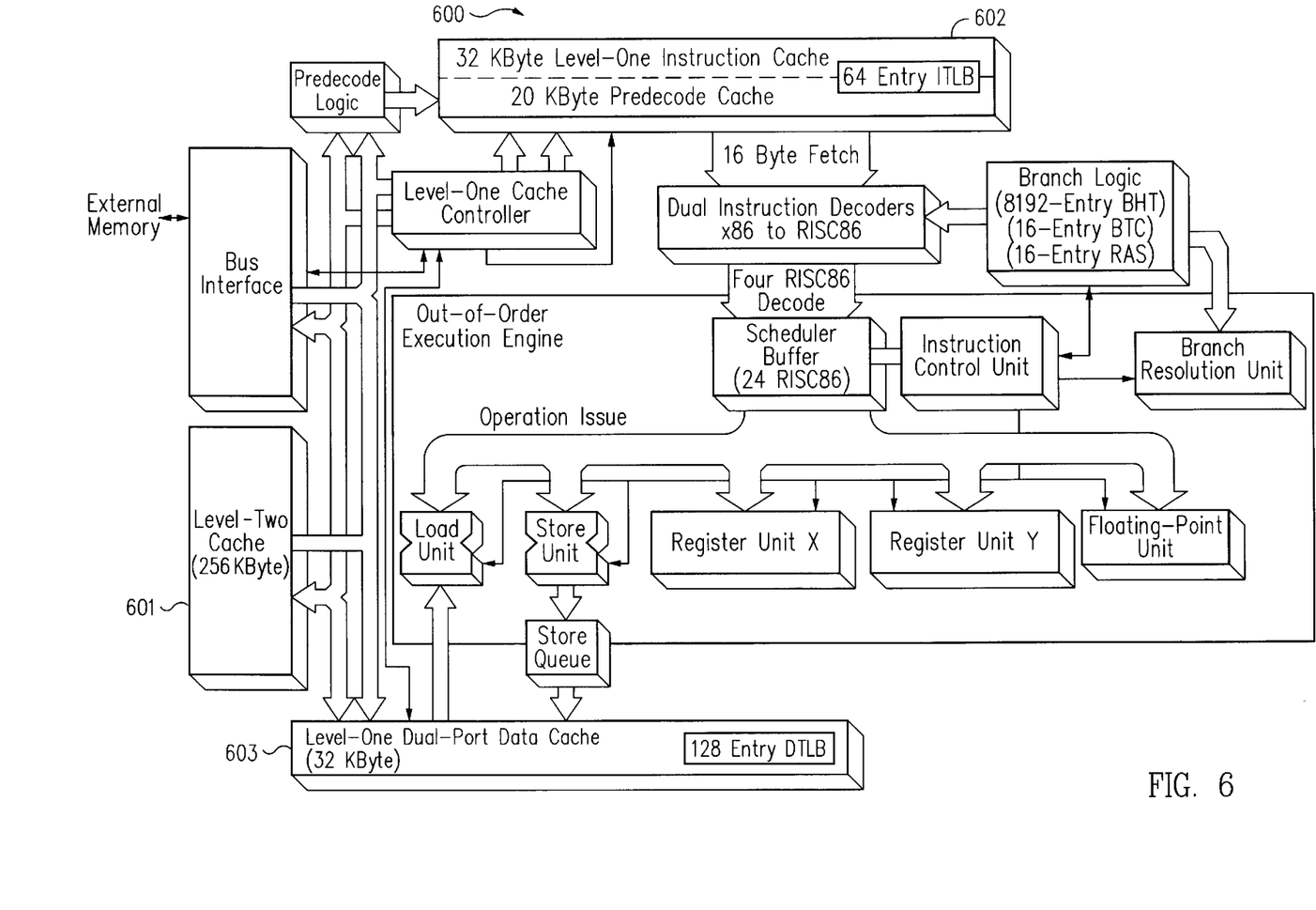
FIG. 6 is a block diagram illustrating an integrated circuit microprocessor architecture including a memory module in accordance with an exemplary embodiment of the present invention.

FIG. 6 depicts an exemplary 400 MHz superscalar ×86 processor 600 that includes an on-chip backside full-speed 256 KB level-2 (L2) write-back cache with on-chip tags. L2 cache 601 is organized as described above with submodule- or bank-resident primary sense amplifiers and secondary sense amplifiers positioned toward the middle of the cache memory module. Various features described above including reductions in minimum-to-maximum variation of round-trip signal paths, disjoint upper and lower global bit-lines, low-voltage-swing global bit-line signaling, and reduced primary sense amplifier footprint allow processor 600 to interact with it's on-chip L2 cache 601 at processor clock speeds and high throughput with low power consumption and reduced layout area.

In an exemplary embodiment, L2 cache 601 is logically organized as a four-way set-associative unified cache with 1K sets and a 64-byte line size. Each line is further divided into two 32-byte blocks. A true least-recently used replacement policy is supported. The LRU information for each set (2 bits per way) is stored in L2 tag RAM. L2 cache 601 uses the MESI protocol to maintain coherency with the level-1 (L1) instruction and data caches (602 and 603) and external memory. Other implementations in accordance with the present invention may build on differing cache organizations and may be configured within differing memory heirarchies.

L2 cache 601 cache runs at a processor clock frequency, and can simultaneously perform one read and one write operation in each clock cycle. To support this functionality, internal portions of the data and tag RAMs run at twice the clock frequency. Compared to an external front-side 100 MHz L2 cache, the on-chip L2 cache provides eight times the bandwidth on a 400 MHz CPU, since it uses separate 64-bit buses for read and write operations. Block read and write latency/throughput for L2 cache 601 is 3/1/1/1. Accesses may be overlapped, such that 64 bits of data can be transferred in each direction between the L1 caches (602 and 603) and L2 cache 601 in each clock cycle.

Physically, L2 cache 601 is split into tag RAM, control and BIST logic, and two instances of a 128 KB data RAM. FIGS. 1 and 2 illustrate one instance of 128 KB data RAM with some control logic. Other aspects of L2 cache 601 are conventional and suitable implementations will be appreciated by persons of ordinary skill in the art. Each 128 KB data RAM includes eight memory banks, which include 1024 columns by 128 rows of memory cells with associated decode, read and write circuits. For a read access, three read address bits are decoded to activate one of eight bank read select pulses at the rising edge of the clock (FIG. 2). This initiates a read access in the selected bank while the remaining seven banks remain dormant. Write operations are performed in a similar manner, but are triggered by the falling edge of the clock. Read and write operations may access the same or different banks in the same clock cycle.

In an exemplary configuration, each half of each 32-byte block is stored in separate instance of data RAM. Because tag way-select signals are generated in parallel with the data RAM reads, each data RAM internally reads four 16-byte half-blocks (one for each way). The 4:1 way selection is performed by static CMOS multiplexers just before data reaches the output registers (see e.g., way select multiplexers 141). As described above, a two-level sensing scheme is used in the memory module to reduce power dissipation of the 64-byte read data path by 50% while maintaining high speed. At the submodule- or bank-level, primary sense amplifiers drive reduced voltage-swing signals onto differential global bit lines (FIG. 3). Separate sets of global bit lines are used to connect the upper and lower groups of four memory banks, which reduces the global bit line capacitance. Upper and lower secondary sense amplifiers (e.g., secondary sense amplifiers 361 and 362) detect the reduced voltage-swing signals on the global bit lines. Like the primary sense amplifiers, the secondary sense amplifiers (see FIG. 5) are strobed, regenerative amplifiers that produce a pulse on either a true or complement output when activated. In an illustrative embodiment, the strobe signal for a set of secondary sense amplifiers (e.g., upper secondary sense amplifiers 361 or lower secondary sense amplifiers 362) is derived from the primary sense amplifier strobes of the four memory banks it serves. Since only one set (upper or lower) of secondary sense amplifiers is activated during a read access, the output latch can simply OR together upper and lower sense amplifier outputs.

In one semiconductor integrated circuit realization of the above-described processor including a memory module (L2 cache) configuration in accordance with the present invention, five layers of aluminum are used in addition to a tungsten local interconnect (LI) layer. The use of both L1 and Metal 1 facilitates a 9.84 $\mu m^2$ cell size. Local bit-lines, which span 128 memory cells within a submodule or bank, are formed as Metal 2. Polysilicon word-lines are strapped in Metal 3. Global bit-lines (e.g., global bit-lines 152 and global bit-lines 153), which span four submodules or banks, are routed in Metal 4. Metal 4 power supply wires are used to shield the global bit-lines from the write data inputs, which are also routed to each of the banks in Metal 4. Metal 5 runs perpendicular to the Metal 4 shielding wires to complete a power grid and to connect to C4 solder balls. In one semiconductor integrated circuit realization, solder balls are not positioned over the memory cell arrays to prevent alpha particle-included soft errors; however, but solder balls are used over the sense amplifier and word line driver areas of the memory module.

A wide variety of computer system configurations are envisioned, each embodying the memory module configurations in accordance with present invention as herein described. For example, one such a computer system includes an integrated circuit realization of processor 600 with on- or off-chip instruction, data and/or predecode caches having a round trip signal path length reducing array configuration, disjoint upper and lower global bit-lines, low-voltage-swing global bit-line signaling, and/or reduced primary sense amplifier footprint in accordance with the present invention, a memory subsystem (e.g., RAM), a display adapter, disk controller/adapter, various input/output interfaces and adapters, and corresponding external devices. Memory, adapters and interfaces are conventionally coupled to such integrated circuit microprocessor (e.g., via busses).

While the invention has been described with reference to various embodiments, it will be understood that these embodiments are illustrative and that the scope of the invention is not limited to them. Many variations, modifications, additions, and improvements of the embodiments described are possible. For example, although embodiments have been described with primary and secondary sense amplifiers, the invention is not limited to two-level sensing. Indeed, based on the description herein, persons of ordinary skill in the art will appreciate a wide variety of multi-level sensing configurations if more than two levels of sensing are employed. In this regard, "primary" and "secondary" will be understood to establish a hierarchical relationship between so-called primary and secondary sense amplifiers. Additional sensing circuits may be employed higher or lower in a multi-level sensing hierarchy while still preserving the relationship between "primary" and "secondary" sense amplifiers and without departing from the spirit and scope of the present invention.

Furthermore, particular array sizes, widths and topologies; column, way and submodule selection techniques; device configurations and process technologies employed are merely illustrative. For example, the teachings of the present invention may be applied to memory types, other than the exemplary static memory described herein. In particular, teachings of the present invention may be applied to dynamic memories and to various read-only and programmable read-only memories. Based on the descriptions herein, persons of ordinary skill in the art will appreciate a large number of variations and suitable modifications to the illustrated configurations. These and other variations, modifications, additions, and improvements may fall within the scope of the invention as defined in the claims that follow.

What is claimed is:

1. A semiconductor memory comprising:
   upper and lower groups of submodules;
   each submodule including an array of memory cells and primary sense amplifiers;
   disjoint upper and lower bit-line pairs, the upper bit-line pairs spanning the upper group of submodules and the lower bit-line pairs spanning the lower group of submodules, the primary sense amplifiers coupled to drive a differential signal onto corresponding of the upper or lower bit-line pairs;
   secondary sense amplifiers placed between the upper and lower groups of submodules, upper ones of the secondary sense amplifiers coupled to corresponding of the upper bit-line pairs, and lower ones of the secondary sense amplifiers coupled to corresponding of the lower bit-line pairs.

2. The semiconductor memory of claim 1, further comprising:
   a round-trip signal path to, and returning from, each of the submodules, wherein path length difference between a shortest and a longest of the round-trip signal paths is reduced by the placement of the secondary sense amplifiers between the upper and lower groups of submodules.

3. The semiconductor memory of claim 2,
   wherein the longest of the round-trip signal paths is no more than 2 times the path length of the shortest of the round-trip signal paths.

4. The semiconductor memory of claim 2,
   wherein the round-trip signal paths include output signal paths from the secondary sense amplifiers, individual of the output signal paths spanning one, but not both, of the upper and lower groups of submodules.

5. The semiconductor memory of claim 2,
   wherein the round-trip signal paths include output signal paths from the secondary sense amplifiers, the output signal paths spanning one, but not both, of the upper and lower groups of submodules.

6. The semiconductor memory of claim 1,
   wherein the upper and lower groups of submodules are of equal number.

7. The semiconductor memory of claim 1,
   wherein the differential signal is a low-voltage-swing differential signal; and
   wherein outputs of the secondary sense amplifiers include full-voltage-swing signals.

8. The semiconductor memory of claim 1,
   wherein outputs of corresponding upper and lower ones of the secondary sense amplifiers are wire ORed onto an output signal path that spans either the upper or the lower group of submodules.

9. The semiconductor memory of claim 1, further comprising
   first signal paths from an uppermost of the submodules, the first signal paths including corresponding of the primary sense amplifiers, corresponding of the bit-line pairs, corresponding of the secondary sense amplifiers, and corresponding output signal paths; and
   second signal paths from a lowermost of the submodules, the second signal paths including corresponding of the primary sense amplifiers, corresponding of the bit-line pairs, corresponding of the secondary sense amplifiers, and corresponding output signal paths,
   wherein the first and the second signal paths are of substantially equal path length.

10. The semiconductor memory of claim 1, further comprising
    first and second signal paths from respective of upper and lower submodules, the first and second signal paths including corresponding of the primary sense amplifiers, corresponding of the bit-line pairs, corresponding of the secondary sense amplifiers, and a combined output signal path that traverses one of the upper and lower submodules,
    wherein the first and the second signal paths are of substantially equal path length.

11. The semiconductor memory of claim 1, configured as a cache integrated on-chip with a processor.

12. In a semiconductor memory, a data path comprising:
    a first differential bit-line pair spanning plural memory cells of a first bank including a first memory cell;
    a first primary sense amplifier coupled between the first differential bit-line pair and coupled to supply a first differential output on a second differential bit-line pair spanning a first group of banks including the first bank, but not a second group of banks disjoint from the first group; and
    a first secondary sense amplifier coupled between the second differential bit-line pair and coupled to supply a fall-voltage swing output on a data line, wherein the data line spans the second group of banks.

13. In a semiconductor memory, the data path of claim 12, further comprising:
    a third differential bit-line pair spanning plural memory cells of a third bank including a third memory cell;
    a second primary sense amplifier coupled between the third differential bit-line pair and coupled to supply a second differential output on a fourth differential bit-line pair spanning the second group of banks; and
    a second secondary sense amplifier coupled between the fourth differential bit-line pair and coupled to supply a full-voltage swing output on the data line.

14. A method of reducing layout area in a semiconductor memory including plural submodules each including an array of memory cells and primary sense amplifiers coupled to respective ones thereof by local bit-lines, the method comprising:
    spanning a first subset of the submodules with first bit-line pairs;
    spanning a second subset of the submodules with second bit-line pairs disjoint from the first bit-line pairs;
    employing multi-level sensing such that individual ones of the primary sense amplifiers drive low-voltage-swing signals on corresponding ones of the first and second bit-line pairs, and thereby reducing a portion of the layout area associated with the primary sense amplifiers.

15. The method of claim 14, employed in a cache memory device,
   wherein numbers of primary sense amplifiers per submodule approach column width of the semiconductor memory; and
   wherein the reduced layout area associated with devices of the primary sense amplifiers provides contributes to an overall layout area reduction of at least about 5–10%.

16. The method of claim 14,
   wherein the portion of layout area associated with devices of the primary sense amplifiers is reduced by a factor of at least about 90%.

17. The method of claim 13,
   wherein the portion of layout area associated with each primary sense amplifier is reduced by at least about 100 microns of gate in a 0.25 micron process.

18. A method of reducing a difference between minimum and maximum delay paths in a semiconductor memory, the method comprising:
   providing plural submodules each including an array of memory cells and primary sense amplifiers coupled to respective ones of the memory cells by local bit-lines,
   spanning a first subset of the submodules with first bit-line pairs coupled to outputs of the primary sense amplifiers of the first subset of submodules;
   spanning a second subset of the submodules with second bit-line pairs coupled to outputs of the primary sense amplifiers of the second subset of submodules, the second bit-line pairs disjoint from the first bit-line pairs; and
   placing secondary sense amplifiers between the first and second subsets of submodules, the secondary sense amplifiers input coupled to respective of the first and second bit-line pairs and output coupled to respective data lines,
   wherein individual ones of the data lines span one, but not both, of the first and second subsets of submodules.

19. A method of reducing power consumption in a semiconductor memory including plural submodules each including an array of memory cells and primary sense amplifiers coupled to respective ones of the memory cells by local bit-lines, the method comprising:
   spanning a first subset of the submodules with first bit-line pairs;
   spanning a second subset of the submodules with second bit-line pairs disjoint from the first bit-line pairs;
   placing secondary sense amplifiers between the first and second subsets of submodules, the secondary sense amplifiers being input coupled to respective of the first and second bit-line pairs and being output coupled to respective data lines,
   wherein the primary sense amplifiers are coupled to drive low-voltage-swing differential signals onto corresponding of the first and second bit-line pairs.

20. A method of improving access time in a semiconductor memory including plural submodules each including an array of memory cells and primary sense amplifiers coupled to respective ones of the memory cells by local bit-lines, the method comprising:
   spanning a first subset of the submodules with first bit-line pairs;
   spanning a second subset of the submodules with second bit-line pairs disjoint from the first bit-line pairs;
   placing secondary sense amplifiers between the first and second subsets of submodules, the secondary sense amplifiers being input coupled to respective of the first and second bit-line pairs and being output coupled to respective data lines;
   wherein wire delay along signal paths from individual of the memory cells is reduced by operating the secondary sense amplifiers as repeaters; and
   wherein maximum to minimum variations round-trip signal paths are reduced by said secondary sense amplifier placement.

* * * * *